United States Patent [19]
Akiyama

[11] Patent Number: 5,270,772
[45] Date of Patent: Dec. 14, 1993

[54] IMAGE-FORMING APPARATUS HAVING A BODY FORMED OF VERTICALLY SEPARABLE BLOCKS

[75] Inventor: Kazunori Akiyama, Osaka, Japan
[73] Assignee: Mita Industrial Co., Ltd., Osaka, Japan
[21] Appl. No.: 917,981
[22] Filed: Jul. 24, 1992

[30] Foreign Application Priority Data
Aug. 14, 1991 [JP] Japan .................. 3-228855

[51] Int. Cl.$^5$ ............................................ G03G 15/00
[52] U.S. Cl. ..................................... 355/200; 206/501
[58] Field of Search ............. 355/200, 202, 260, 210; 206/501

[56] References Cited
U.S. PATENT DOCUMENTS

| | | | |
|---|---|---|---|
| 4,436,634 | 3/1984 | Wells | 210/800 |
| 4,542,976 | 9/1985 | Kasamura | 352/200 |
| 4,896,190 | 1/1990 | Uchida et al. | 355/202 |
| 4,947,208 | 8/1990 | Komatsu et al. | 355/200 |
| 4,951,090 | 8/1990 | Matsumoto et al. | 355/200 |
| 5,049,946 | 9/1991 | Harada | 355/200 |

Primary Examiner—A. T. Grimley
Assistant Examiner—Sandra L. Brasé
Attorney, Agent, or Firm—Wenderoth, Lind & Ponack

[57] ABSTRACT

In order to reduce the amount of time and labor normally necessary for delivery of a large-sized image-forming apparatus, the apparatus is constructed with a body formed of divided blocks, each of which has a height which is less than each of the width, the depth and the height of the assembled body. The divided blocks are connected with each other such that they are vertically separable. In addition, the respective divided blocks are provided with handles for carrying them with the height dimension thereof oriented horizontally.

5 Claims, 3 Drawing Sheets

IMAGE-FORMING APPARATUS HAVING A BODY FORMED OF VERTICALLY SEPARABLE BLOCKS

BACKGROUND OF THE INVENTION

1. Field of the Invention

The present invention relates to a large-sized image-forming apparatus, such as console-type copying machine, used placing directly on a floor surface.

2. Description of the Prior Art

With a large-sized image-forming apparatuse, such as console-type copying machine, problems have ocurred in that the respective sizes of width, depth and height thereof are increased as compared with those in a small-sized image-forming apparatus, so that it cannot be carried in a room through a door and the like when it is delivered to a user in many cases and also a weight is increased, so that it takes much time and labor to carry it in said room.

SUMMARY OF THE INVENTION

The present invention has been achieved paying attention to the above described points and it is an object of the present invention to provide an image-forming apparatus capable of reducing time and labor taken for a delivery thereof.

In order to achieve the above described object, an image-forming apparatus according to the present invention is characterized in that a body comprises divided blocks having a height less than every size of width, depth and height thereof connected with each other so as to be dividable up and down.

According to the above described construction, said body of said image-forming apparatus can be divided up and down into said divided blocks having said height less than every size of width, depth and height thereof, so that the body can be divided into every divided block which can be carried in the room even through a door and the like through which the body cannot be carried in the room.

DETAILED DESCRIPTION OF THE PREFERRED EMBODIMENTS

The preferred embodiments of the present invention will be below described with reference to the drawings.

Figure 1:
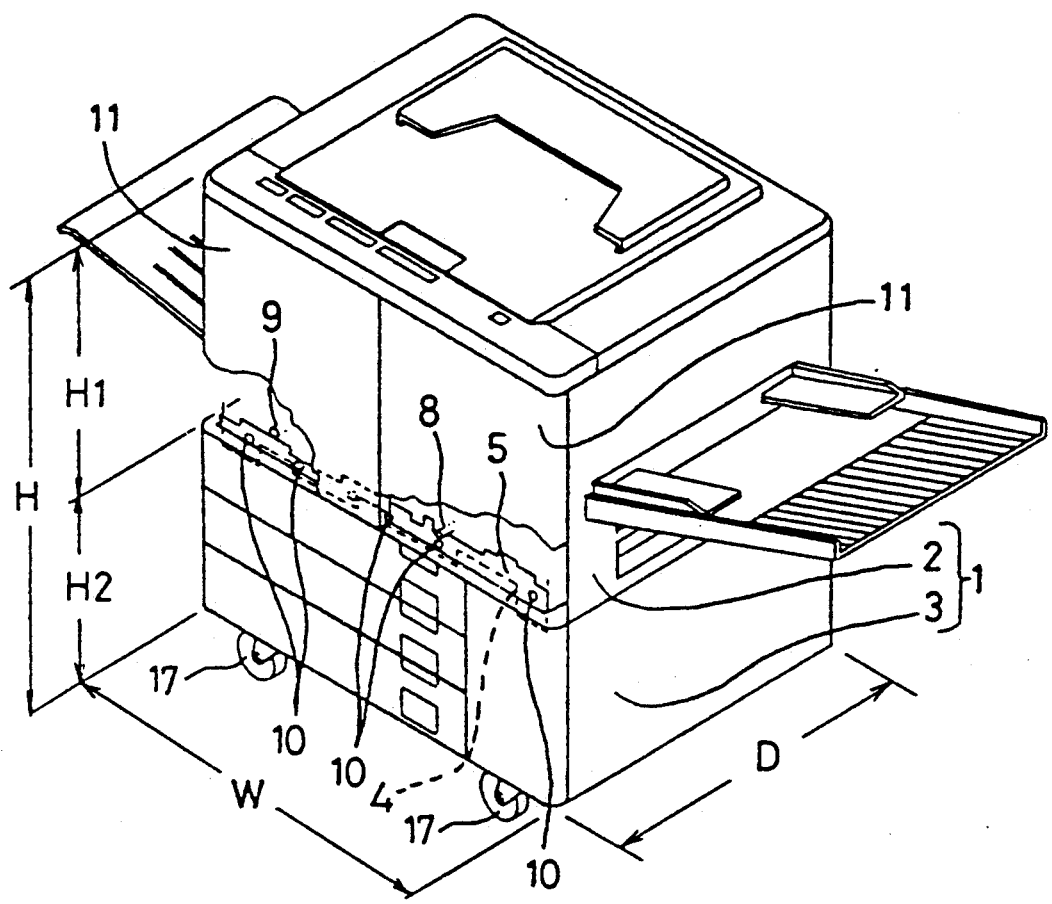
FIG. 1 is a partially fractured perspective view showing an image-forming apparatus according to one preferred embodiment.
Figure 2:
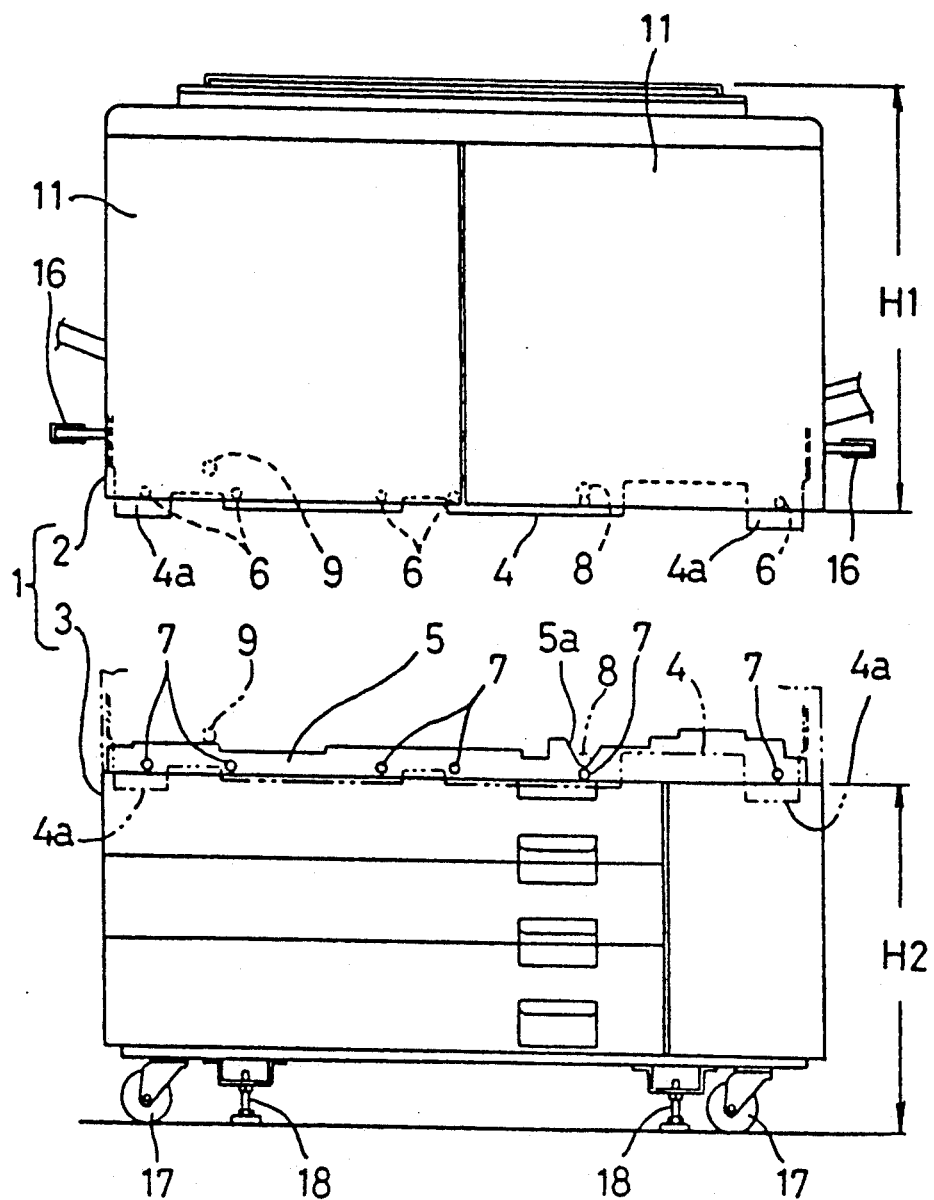
FIG. 2 is a disintegrated front view showing said image-forming apparatus.
Figure 3:
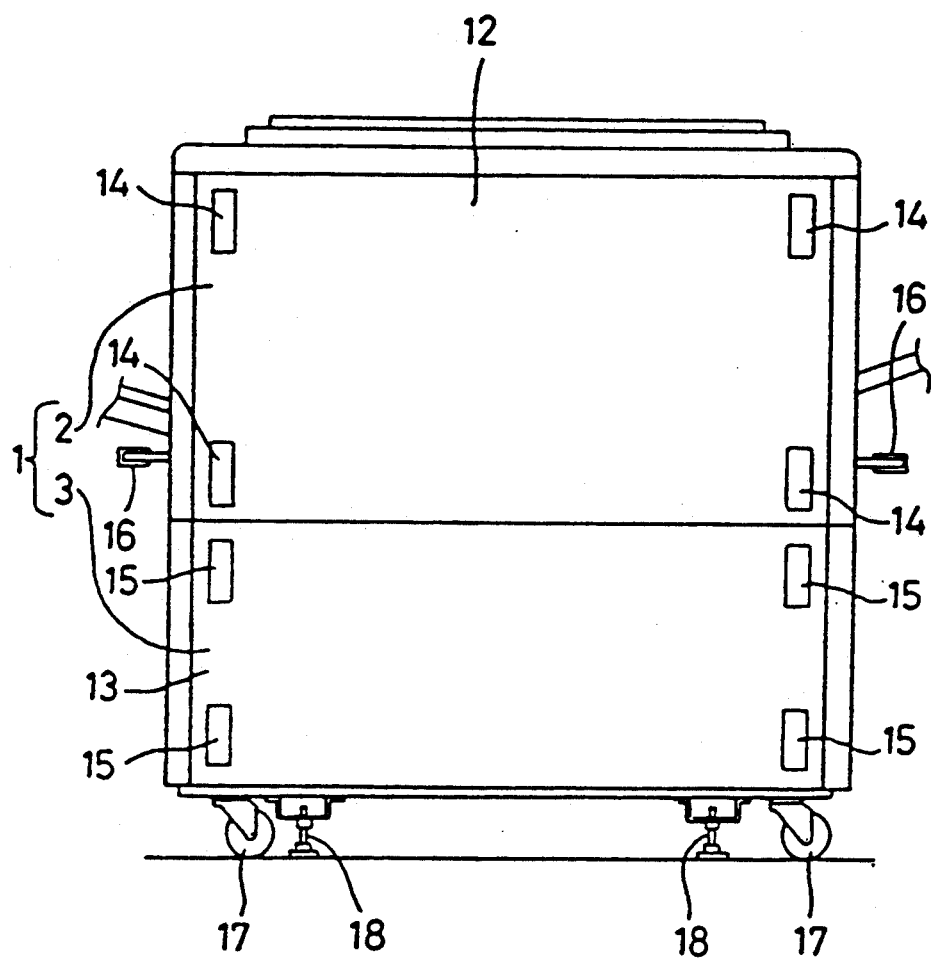
FIG. 3 is a back view showing the image-forming apparatus.

FIG. 1 is a partially fractured perspective view showing a rough construction of an image-forming apparatus according to the present invention, FIG. 2 being a disintegrated front view showing said image-forming apparatus, and FIG. 3 being a back view showing the image-forming apparatus.

The image-forming apparatus according to this preferred embodiment is a console-type electrostatic photographic copying machine used placing directly on a floor surface and a body 1 thereof comprises an upper divided block 2, in which a copying mechanism is included, and a lower divided block 3, in which a paper-supplying mechanism is included, connected with each other so as to be dividable up and down.

Provided that a width of said body 1 is W, a depth D, and a height H in this case, a height H1 of said upper divided block 2 and a height H2 of said lower divided block 3 are set so as to be shorter than every one of W, D and H. That is to say, said height H1 and said hight H2 of the respective divided blocks 2, 3 obtained by dividing the body 1 are set so as to be shorter than a size of the shortest side of the body 1 before divided.

The upper divided block 2 is provided with an upper harness 4 for connecting it with the lower divided block 3 on a front surface side and a back surface side of a lower end thereof while the lower divided block 3 is provided with a lower harness 5 for connecting it with the upper divided block 2 on a front surface side and a back surface side of an upper end thereof.

As shown in FIG. 2, said lower harness 4 of the upper divided block 2 is provided with a plurality of tapped holes 6 and said lower harness 5 of the lower divided block 3 is provided with a plurality of screw-passing holes 7 corresponding to the respective tapped holes 6 of the upper harness 4. In addition, the upper divided block 2 is provided with positioning pins 8, 9 laid in the back and forth direction in the vicinity of said lower end thereof, one positioning pin 8 being engaged with a V letter-shaped engaging groove 5a formed in a part of said upper end of the lower harness 5, and the other positioning pin 9 being received by the other part on the upper end of the lower harness 5.

The upper harness 4 of the upper divided block 2 is put on an inside of the lower harness 5 under the condition that the positioning pin 8 of the upper divided block 2 is engaged with said engaging groove 5a of the lower harness 5 of the lower divided block 3 and the other positioning pin 9 is laid on the other part of the upper end of the lower harness 5 so that the tapped holes 6 thereof may be put upon said corresponding screw-passing holes 7 of the lower harness 5 of the lower divided block 3, as shown by a chain line in FIG. 2. Screws 10 are screwed in the corresponding tapped holes 6 through the respective screw-passing holes 7 to connect the upper divided block 2 with the lower divided block 3. In this case, said screws 10 are let to be different from other screws used for other connections in color to easily distinguish the screws to be loosened when the body 1 is divided into the upper divided block 2 and the lower divided block 3.

A part 4a including four courners of the upper harness 4 is projected below a front surface cover 11 of the upper divided block 2 on a front surface side of the body 1 and projected below a rear cover 12 of the upper divided block 2 on a rear surface side of the body 1. In particular, portions at said four corners of these projected members 4a are provided with a horizontal plane surface formed at a lower end thereof so as to be used as support legs for a temporary installation when divided.

As shown in FIG. 3, said rear covers 12, 13 on said rear surfaces of the upper divided block 2 and the lower divided block 3 are provided with handles 14, 15 for carrying the divided blocks 2, 3 so that the shortest side, in short a side in the direction of height, of the divided blocks 2, 3 may take a horizontal posture in a sunk manner at the four corners thereof.

In addition, the upper divided block 2 is provided with a handle 16 used for a moving operation when it is connected with the lower divided block 3 to function as the body 1 on both side portions thereof and the lower divided block 3 is provided with a caster 17 on a bottom portion thereof. Furthermore, the lower divided block 3 is provided with also a separete stopper 18 used at the installation on a bottom portion thereof.

Procedures for carrying the image-forming apparatus in the room will be below described.

In the case where for example the door is narrow, so that the image-forming apparatus cannot be carried in the room as it is even though it takes any posture, in short the width of the door is smaller than any of the width W, the depth D and the height H of the body 1, the body 1 is divided into the upper divided block 2 and the lower divided block 3 to be carried in the room.

That is to say, for example, said front surface cover 11 is opened on the front portion side of the body 1 to remove the screws 10 connecting the upper harness 4 of the upper divided block 2 with the lower harness 5 of the lower divided block 3. Since the screws 10 are let to be different from the other screws in color, the serviceman in charge of the dividing operation can easily distinguish the screws 10. Also on the rear surface side of the body 1, the rear cover 13 is removed almost similarly to remove the screws 10 in the similar procedures. Thus, the body 1 is divided into the upper divided block 2 and the lower divided block 3. Besides, since a portion, where the upper harness 4 is connected with the lower harness 5, is covered with the front surface cover 11 and the rear cover 12 on the front surface side and the rear surface side, respectively, under the connected condition, an external appearance is not spoiled.

In the case where the divided upper divided block 2 is carried in the room, if it is lifted up on said handle 14 provided in the rear cover 12, it can be carried in the room so that the side having the height H1, in short the shortest side, may take said horizontal posture. So, the upper divided block 2 can be carried in the room by adjusting the shortest side thereof to the width of the door. Also the lower divided block 3 can be similarly carried in the room by means of a handle 15 of a rear cover 13 thereof.

After the respective divided blocks 2, 3 were carried in the room, the upper divided block 2 is put on the lower divided block 3 under the condition before divided and the upper harness 4 is connected with the lower harness 5 by means of the screws 10 to assemble the original body 1.

The present invention has the above described construction and the body of the image-forming apparatus comprises the divided blocks having the height less than every size of width, depth and height thereof connected with each other so as to be dividable up and down, so that it can be easily carried in the room without taking much time and labor under the condition that it is divided into the respective divided blocks even when it cannot be carried in the room through the door and the like as it is.

What is claimed is:

1. An image-forming apparatus comprising:
  a body formed of vertically separable divided blocks connected together, each of said divided blocks having a height dimension which is less than each of a width dimension, a depth dimension and a height dimension of said body when said divided blocks are connected together;
  wherein said divided blocks include an upper divided block and a lower divided block;
  wherein harnesses are respectively provided at front and rear sides of a lower end of said upper divided block and at front and rear sides of an upper end of said lower divided block; and
  wherein screw holes are formed in each of said harnesses and are respectively aligned with one another when said upper and lower divided blocks are connected.

2. An image-forming apparatus as recited in claim 1, wherein
  a positioning pin is provided on at least one of said harnesses repectively provided at said front and rear sides of said lower end of said upper divided block; and
  an engaging groove is provided in at least one of said harnesses respectively provided at said front and rear sides of said upper end of said lower divided block, said engaging groove and said positioning pin being aligned with one another when said upper and lower divided blocks are connected.

3. An image-forming apparatus as recited in claim 1, wherein
  each of said divided blocks is provided with at least one handle for use in carrying the respective divided block with the height dimension thereof oriented horizontally.

4. An image-forming apparatus as recited in claim 3, wherein
  said at least one handle of each of said divided blocks is provided on a rear surface thereof.

5. An image-forming apparatus as recited in claim 1, wherein
  support legs are provided for said divided blocks to provide tempory support when said divided blocks are separated.

* * * * *